(12) United States Patent
Maeda

(10) Patent No.: US 7,336,495 B2
(45) Date of Patent: Feb. 26, 2008

(54) POWER COMPONENT COOLING DEVICE WITH A HEAT SINK AND ONE OR MORE COOLING FINS

(75) Inventor: Takashi Maeda, Fukuoka (JP)

(73) Assignee: Kabushiki Kaisha Yaskawa Denki, Fukuoka (JP)

(*) Notice: Subject to any disclaimer, the term of this patent is extended or adjusted under 35 U.S.C. 154(b) by 190 days.

(21) Appl. No.: 11/153,495

(22) Filed: Jun. 16, 2005

(65) Prior Publication Data
US 2005/0280997 A1 Dec. 22, 2005

(30) Foreign Application Priority Data
Jun. 16, 2004 (JP) .................. P.2004-178424

(51) Int. Cl.
*H05K 7/20* (2006.01)
(52) U.S. Cl. ...................... 361/717; 361/697
(58) Field of Classification Search ............ 361/717, 361/697, 703, 719
See application file for complete search history.

(56) References Cited
U.S. PATENT DOCUMENTS 3,081,824 A * 3/1963 Macall ................ 165/179
3,416,597 A * 12/1968 Kupferberg ............ 165/80.3
6,201,699 B1 * 3/2001 Ayres et al. ............ 361/707
6,493,227 B2 * 12/2002 Nielsen et al. ........... 361/703
6,577,504 B1 * 6/2003 Lofland et al. .......... 361/709
6,580,608 B1 * 6/2003 Searls et al. ............ 361/690
7,031,162 B2 * 4/2006 Arvelo et al. ........... 361/718

FOREIGN PATENT DOCUMENTS
JP 2002-184920 A 6/2002
JP 2003-152368 A 5/2003

\* cited by examiner

*Primary Examiner*—Hae Moon Hyeon
(74) *Attorney, Agent, or Firm*—Sughrue Mion, PLLC

(57) ABSTRACT

Where power components are fixed on a heat sink 1 inclusive of a heat sink base 1b and cooling fins 1a provided on the heat sink base 1b, one 1c of the cooling fins, which is made thicker, is arranged upright on the heat sink base 1b. And a high heat-generating power component 3 is fixed to the heat sink base 1b and middle heat-generating power components 5, 6 are fixed to the cooling fin 1c.

7 Claims, 2 Drawing Sheets

POWER COMPONENT COOLING DEVICE WITH A HEAT SINK AND ONE OR MORE COOLING FINS

BACKGROUND OF THE INVENTION

This invention relates to a cooling device for a power component such as an IPM (Intelligent Power Module), a rectifying diode and a shunt resistor mounted on a board within e.g. servo-amplifier.

Where heat dissipation is attempted for power components using a heat sink, a conventional power component cooling device is designed so that several power components are arranged on a surface of the heat sink (for example, see Patent References 1 and 2).

[Patent Reference 1] JP-A-2003-152368
[Patent Reference 2] JP-A-2002-184920

The invention described in Patent Reference 1 intends to effectively dissipate the heat generated from a high heat-generating electronic member outside a case. For this purpose, a circuit board on which a plurality of electronic components are mounted is housed in the case. Among these electronic components, a high heat-generating component(s) having a high heating value and a low heat-generating component(s) having a low heating value are classified. And between the high heat-generating electronic component and the case, a heat-conductive member is individually located to connect them so that only the high heat-generating electronic component is mounted on the one end of the circuit board and only the low heat-generating electronic component is mounted on the other end thereof opposite to the one end.

The invention described in Patent Reference 2 provides a heat dissipating device capable of giving high heat dissipating effect while preventing overload for a heat dissipating component such as Central Processing Unit. For this purpose, two thin metallic heat dissipating plates having elasticity are stacked and a high heat-conductive rubber is provided between the CPU and the metallic heat dissipating plates.

The conventional power component cooling device described in these Patent References 1 and 2 is commonly shown in FIGS. 3 and 4.

FIG. 3 is a top view of the conventional power component cooling device and FIG. 4 is a front view thereof.

In FIGS. 3 and 4, reference numeral 11 denotes a unit constituting component that is a heat sink equipped with cooling fins 11a on the rear surface; 12 a power board secured to the heat sink; 13 a high heat-generating power component such as the IPM mounted on the power board 12; 15 a middle heat-generating component such as a rectifying diode mounted on the power board 12; and 16 another middle heat-generating power component such as a shunt resistor mounted on the power board 12. In this configuration, cooling for the respective power components is carried out through the heat sink in intimated contact with the heat dissipating faces of the power components.

However, the conventional power component cooling device presented a problem that in carrying out the heat dissipation for the power components using the heat sink, a large space is required because several power components are arranged on the one surface of the heat sink, thus increasing the size of the heat sink.

It also presented a problem that since the high heat-generating component and middle heat-generating component are arranged on the same surface, a uniform temperature distribution cannot be obtained, thus making it impossible to use the capability of the heat sink effectively.

SUMMARY OF THE INVENTION

This invention is accomplished to solve these problems. An object of this invention is to provide a power component cooling device which can arrange power components on a heat sink with space savings and effectively use the capability of the heat sink.

In order to solve the above problem, the invention described in aspect 1 of this invention relates to a power component cooling device comprising a heat sink including a heat sink base and a cooling fin provided on the heat sink base, a high heat-generating power component fixed to the heat sink base and a middle heat heat-generating power component fixed to the cooling fin.

The invention described in aspect 2 relates to a power component cooling device according to aspect 1, wherein a plurality of cooling fins are arranged upright on the heat sink base.

The invention described in aspect 3 relates to a power component cooling device according to aspect 2, wherein a part of the cooling fins employed as the heat sink base is made thicker than the other cooling fins.

The invention described in aspect 4 relates to a power component cooling device according to aspect 1, wherein a high heat-generating power board on which the high heat-generating power component is mounted and a middle heat-generating power board on which the middle heat-generating power component is mounted are separately provided.

The invention described in aspect 5 relates to a power component cooling device according to aspect 4, wherein the middle heat-generating power board and the high heat-generating power board are arranged on the heat sink to be perpendicular to each other.

DETAILED DESCRIPTION OF THE PREFERRED EMBODIMENTS

Now referring to the attached drawings, an explanation will be given of a concrete embodiment of this invention.

Figure 1:
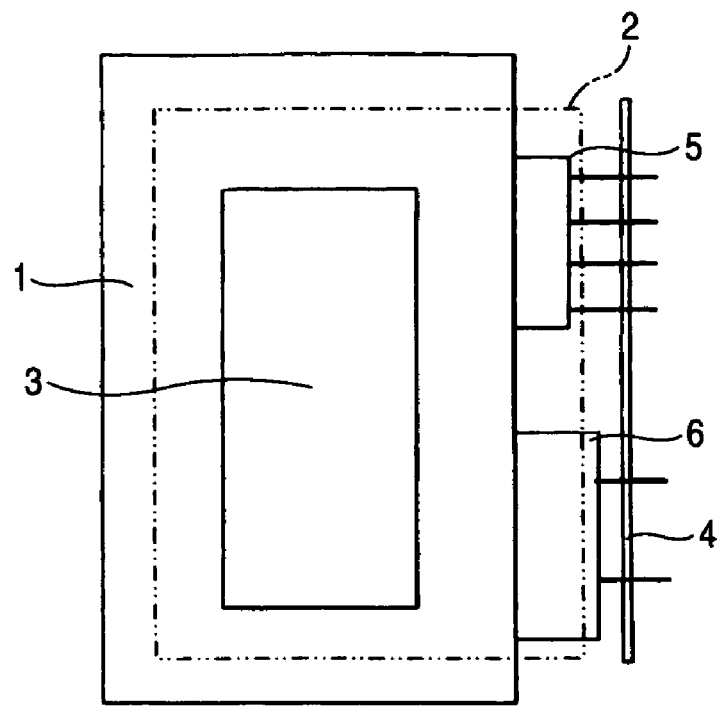
FIG. 1 is a top view of the power component cooling device showing an embodiment of this invention.

FIG. 1 is a top view of the power component cooling device showing an embodiment of this invention.

Figure 2:
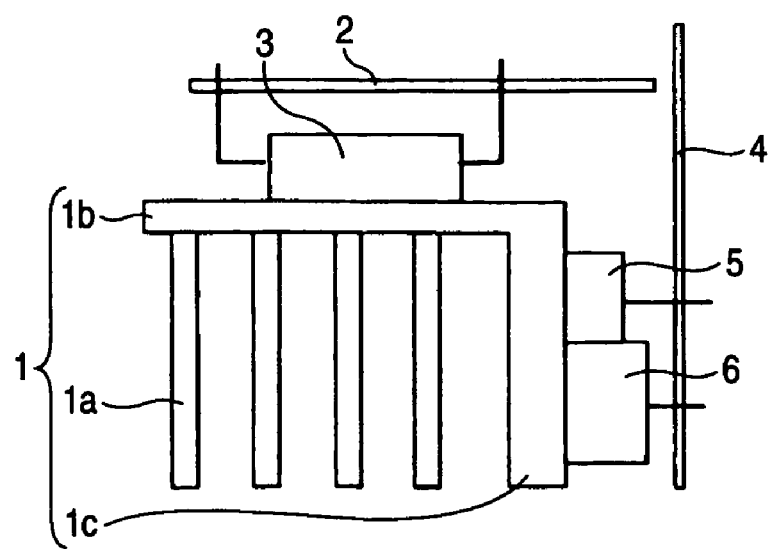
FIG. 2 is a front view of the power component cooling device showing an embodiment of this invention.
Figure 3:
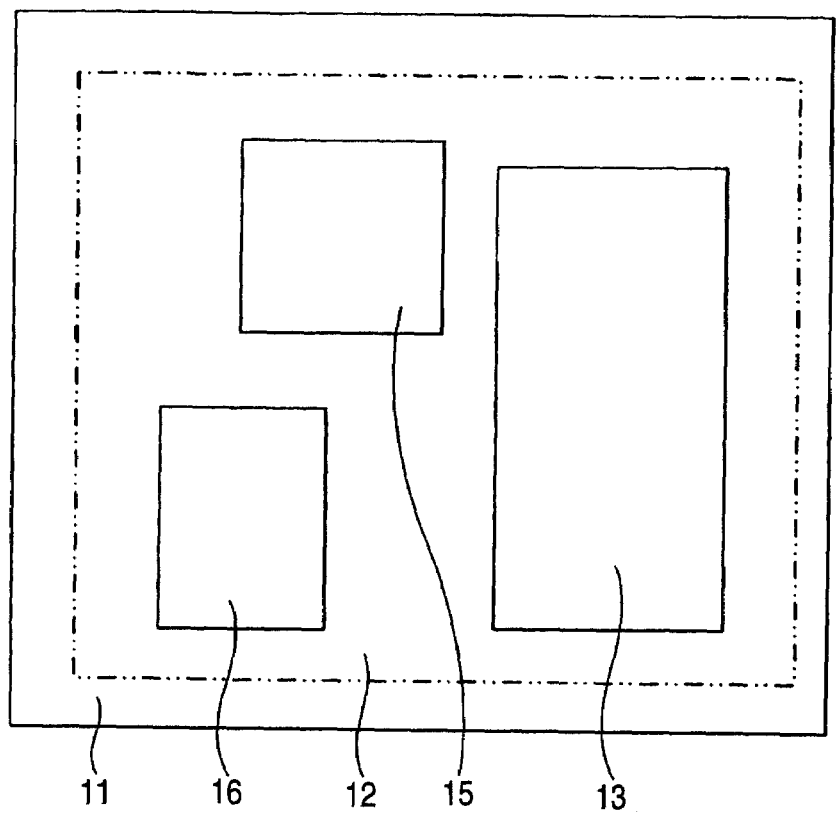
FIG. 3 is a top view of a conventional power component cooling device.
Figure 4:
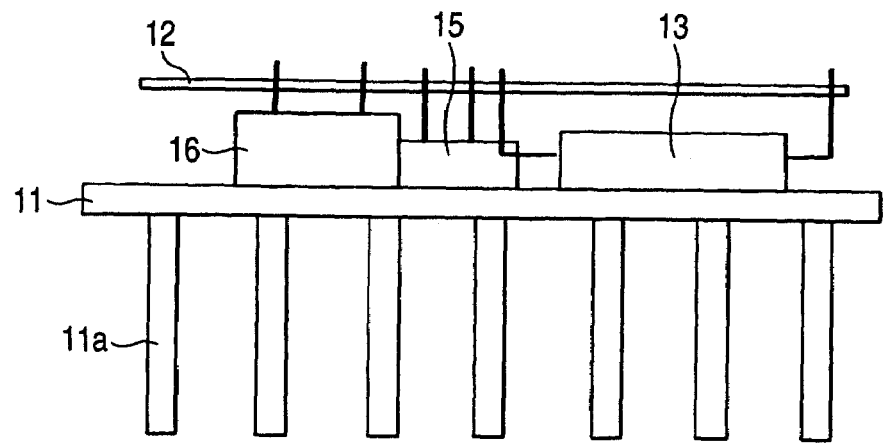
FIG. 4 is a front view of the conventional power component cooling device.

FIG. 2 is a front view of the power component cooling device showing an embodiment of this invention.

In FIGS. 1 and 2, reference numeral 1 denotes a unit constituting component that is a heat sink including a heat sink base 1b and a plurality of cooling fins 1a attached thereto; 2 a high heat-generating power board on which a high heat-generating power component such as IPM is mounted; 3 a high heat-generating power component such as IPM mounted on the high heat-generating power board 2; 4 a middle heat-generating power board on which a middle heat-generating power component such as a rectifying diode is mounted; 5 a middle heat-generating power component such as the rectifying diode mounted on the middle heat-generating power board 4; and 6 another middle heat-generating power component such as a shunt resistor mounted on the middle heat-generating power board.

In this configuration, a part of the cooling fins 1a is employed as a heat sink base 1c to which the middle heat-generating components 5 and 6 are attached.

The cooling fin 1c is made thicker than the other cooling fins 1a. Thus, the thickness of the cooling fin 1c is made close to that of the heat sink base 1b or made greater than it as required.

The conventional power board is divided into two boards inclusive of the high heat-generating power board 2 and the middle heat-generating power board 3 which are located perpendicularly to each other. This permits the size of the heat sink to be reduced.

Further, the heat dissipation of the high heat-generating power component is mainly done by the cooling fins 1a which is located upright behind the heat sink 1. The cooling of the middle heat-generating power components 5 and 6 is mainly done by the plane plate of the heat sink base 1c. For this reason, good balance of the heat sink cooling performance is obtained so that the cooling capability of the heat sink can be effectively used.

As described above, in accordance with this invention, the high heat-generating power component is fixed to the heat sink base and the middle heat-generating power components are fixed to the cooling fin so that the capability of the heat sink can be effectively used. In addition, since the plurality of cooling fins are arranged upright on the heat sink base, the capability of the heat sink capability can be effectively used with space savings.

Further, since a part of the cooling fins employed as the heat sink base is made thicker than the other cooling fins, the middle heat-generating power components can be effectively cooled. Further, the high heat-generating power board and the middle heat-generating power board are separately arranged on the heat sink so that they are perpendicular to each other. This greatly contributes to the space savings.

In this way, in accordance with this invention, the heat sink can be downsized and the heat sink capability can be effectively used.

In accordance with the invention described in aspect 1, the high heat-generating power component is fixed to the heat sink base and the middle heat-generating power component is fixed to the cooling fin so that the capability of the heat sink can be effectively used.

In accordance with the invention described in aspect 2, since a plurality of cooling fins are arranged upright on the heat sink base, the capability of the heat sink can be effectively used with space savings.

In accordance with the invention described in aspect 3, since a part of the cooling fins employed as the heat sink base is made thicker than the other cooling fins, the middle heat-generating power component can be effectively cooled.

In accordance with the invention described in aspect 4, a high heat-generating power board on which the high heat-generating power component is mounted and a middle heat-generating power board on which the middle heat-generating power component is mounted are separately provided, they can be provided at the positions giving space savings, respectively.

In accordance with the invention described in aspect 5, since the middle heat-generating power board and the high heat-generating power board are arranged on the heat sink so that they are perpendicular to each other, the space savings can be realized to a maximum degree.

What is claimed is:

1. A power component cooling device comprising:
    a heat sink including a heat sink base and a first cooling fin provided on the heat sink base,
    a high heat-generating power component fixed to the heat sink base, and
    a middle heat-generating power component fixed to the first cooling fin; wherein
    a high heat-generating power board on which the high heat-generating power component is mounted and a middle heat-generating power board on which the middle heat-generating power component is mounted are separately provided.

2. The power component cooling device according to claim 1, wherein
    a plurality of cooling fins other than said first cooling fin are arranged upright on the heat sink base.

3. The power component cooling device according to claim 2, wherein
    the first cooling fin is thicker than each of said plurality of cooling fins.

4. The power component cooling device according to claim 2, wherein at least one of said plurality of cooling fins are substantially parallel to the first cooling fin.

5. The power component cooling device according to claim 1, wherein
    the middle heat-generating power board and the high heat-generating power board are arranged on the heat sink to be perpendicular to each other.

6. The power component cooling device according to claim 1,
    wherein the first cooling fin is at an angle to the heat sink base.

7. The power component cooling device according to claim 6, wherein the first cooling fin is perpendicular to the heat sink base.

* * * * *